United States Patent
Dawkins et al.

(10) Patent No.: US 10,848,948 B1
(45) Date of Patent: Nov. 24, 2020

(54) LOW POWER, LOW LATENCY, HIGH DUTY CYCLE SCAN FOR BLUETOOTH LOW ENERGY

(71) Applicant: Apple Inc., Cupertino, CA (US)

(72) Inventors: Mark T. Dawkins, Campbell, CA (US); Guy Bitton, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/818,151

(22) Filed: Mar. 13, 2020

(51) Int. Cl.
| | |
|---|---|
| H04W 4/80 | (2018.01) |
| H04B 7/00 | (2006.01) |
| H04B 1/16 | (2006.01) |
| H03G 3/30 | (2006.01) |
| H04L 27/152 | (2006.01) |

(52) U.S. Cl.
CPC ............ *H04W 4/80* (2018.02); *H03G 3/3036* (2013.01); *H04B 1/16* (2013.01); *H04L 27/152* (2013.01); *H03G 2201/103* (2013.01); *H03G 2201/307* (2013.01)

(58) Field of Classification Search
CPC ....... H04W 4/80; H04W 40/12; H04W 48/10; H04W 52/02; H04W 52/0245; H04W 72/1231; H04B 1/04; H04B 17/318; H04M 1/0202; H04M 1/7253; H04M 2250/04
See application file for complete search history.

(56) References Cited

U.S. PATENT DOCUMENTS

| | | | | |
|---|---|---|---|---|
| 8,712,330 | B2* | 4/2014 | Desai | H04B 17/318 455/63.1 |
| 8,737,917 | B2* | 5/2014 | Desai | H04W 4/80 455/41.2 |
| 8,874,034 | B2* | 10/2014 | Walley | H04W 16/14 455/41.2 |
| 9,668,297 | B2* | 5/2017 | Kamath | H04W 52/0216 |
| 10,291,755 | B2* | 5/2019 | Knaappila | H04W 4/80 |
| 10,334,528 | B2* | 6/2019 | Viswanadham | H04W 52/028 |
| 10,492,055 | B2* | 11/2019 | Ko | H04W 8/005 |
| 2017/0245204 | A1* | 8/2017 | Kumar | H04W 52/0238 |

* cited by examiner

*Primary Examiner* — Quochien B Vuong
(74) *Attorney, Agent, or Firm* — Kilpatrick Townsend & Stockton

(57) ABSTRACT

A system, method and apparatus for simultaneously minimizing power and latency in a scan for advertisement packets from one or more peripheral devices in a Bluetooth Low Energy (BLE) frequency band having a number of advertisement channels. A receiver front end receives BLE signals, and a local oscillator (LO) generator has an output frequency that is sequentially tuned to a frequency of each of the advertisement channels. An energy detector monitors signal energy on each of the advertisement channels in sequence, and when the signal energy exceeds a threshold, fixes the output frequency of the LO generator to that advertisement channel. An automatic gain controller controls a gain of the signal on the one of the plurality of advertisement channels to generate a controlled gain signal, and a correlator correlates the controlled gain signal with an advertisement packet on the one of the advertisement channels.

20 Claims, 3 Drawing Sheets

LOW POWER, LOW LATENCY, HIGH DUTY CYCLE SCAN FOR BLUETOOTH LOW ENERGY

TECHNICAL FIELD

The subject matter described herein relates to low energy wireless communications, and more particularly to a system and method for low power, low latency and high duty cycle scans for wireless channels such as Bluetooth Low Energy (BLE).

BACKGROUND

A key feature of the Bluetooth Low Energy (BLE) standard is the concept of advertising, where peripheral devices periodically transmit short packets including information on their capabilities and as a means to begin the process of connection to a Master Bluetooth device (such as a smartphone or smart watch).

Advertising packets are transmitted at regular intervals, which intervals can be short (e.g. 30 ms) or very long (many hundreds of milliseconds to many seconds). Each packet is relatively short, <330 μs long. In the Industrial, Scientific, and Medical (ISM) band, for example, at 2.4 GHz, there are three advertising channels available, and identical packets are sent in each channel in sequence.

In order to receive an advertising packet, a device must tune its receiver to these advertising channels, which in the ISM band are spaced 24 MHz and 54 MHz apart, and listen for the packets for a period of time, which consumes power. To increase the probability of detecting an advertising packet, and hence to reduce the detection latency, listening time (receiver scan duty cycle) should be increased. However, increasing listening time costs power and limits opportunities for sharing the receiver blocks in a potentially cost and/or space constrained device.

Accordingly, what is needed is a method to minimize power consumed by the BLE advertising scan functionality, while at the same time achieving very low latency (approach 100% duty cycle) without using blocks which consume significant power, and/or are typically shared in a receiver, such as a variable gain amplifier (VGA), an analog to digital converter (ADC) or other digital receiver components.

SUMMARY

In one aspect, an apparatus is disclosed for simultaneously minimizing power and latency in a scan for advertisement packets from one or more peripheral devices in a Bluetooth Low Energy (BLE) frequency band having a number of advertisement channels, the apparatus includes a receiver front end configured to receive signals in the BLE frequency band, and a local oscillator (LO) generator having an input connected with an output of the receiver front end. The LO generator has an output frequency that is sequentially tuned, in a repeating sequence, to a frequency of each of the advertisement channels at the output of the receiver front end. The apparatus further includes an energy detector connected with the receiver front end, and configured to monitor signal energy on each of the advertisement channels in the repeating sequence. When the signal energy of a signal exceeds a threshold energy level on one of the plurality of advertisement channels, the energy detector fixes the output frequency of the LO generator to the one of the plurality of advertisement channels. The apparatus further includes an automatic gain controller configured to control a gain of the signal on the one of the advertisement channels to generate a controlled gain signal, and a correlator to correlate the controlled gain signal from the automatic gain controller with an advertisement packet on the one of the advertisement channels.

In some variations one or more of the following features can optionally be included in any feasible combination. For instance, the apparatus can further include a controller configured to tune the output frequency of the LO generator, and in response to receiving an indication of the signal energy of the signal exceeding the threshold energy level, enable the automatic gain controller and correlator. In some implementations, the controlled gain signal represents the advertisement packet, the advertisement packet includes a preamble and an access address, and the correlator is configured to correlate the preamble and/or a first portion of the access address with the advertisement packet.

In exemplary implementations, the output frequency of the LO generator is switched from a first of the advertisement channels to a next advertisement channel in less than 1 microsecond. Further, the energy detector may be configured to settle on the signal energy from the receiver front end within approximately 1 microsecond from the LO generator switching to the next advertisement channel.

In other variations, the apparatus can further include a variable gain amplifier (VGA) and an analog to digital converter and digital receiver (ADC/digitalRx), where the VGA and ADC/digitalRx are enabled by the controller after receiving the indication of the signal energy of the signal exceeding the threshold energy level.

In another aspect, a communication system is disclosed for receiving signals in a Bluetooth Low Energy (BLE) frequency band having a number of advertisement channels. The system includes a receiver front end configured to receive the signals in the BLE frequency band, the receiver front end having an output, and a variable gain amplifier (VGA) in communication with the output of the receiver front end. The VGA is enabled upon a detection of signals representing an advertisement packet on one of the advertisement channels to amplify the signals. The system further includes an analog to digital converter and digital receiver (ADC/digitalRx) in communication with the VGA, the ADC/digitalRx being enabled upon the detection and a correlation of the signals with the advertisement packet to demodulate the amplified signals. The system further includes a low-power scanner configured for the detection and the correlation. The low-power scanner can be implemented as an apparatus as described above.

In yet another aspect, in a Bluetooth Low Energy (BLE) receiver having a receiver front end, a variable gain amplifier (VGA), and an analog to digital converter and digital receiver (ADC/digitalRx), a method of minimizing power and latency in a scan for advertisement packets from one or more peripheral devices in a BLE frequency band having a number of advertisement channels is disclosed. The method includes the step of sequentially tuning, in a repeating sequence, an output frequency of a LO generator to a frequency of each of the plurality of advertisement channels at an output of the receiver front end, the output frequency of the LO generator being switched from a first of the advertisement channels to a next of the advertisement channels in less than 1 microsecond. Upon switching the output frequency of the LO generator to the next advertisement channel, the method includes the step of setting an energy detector to monitor signal energy on the output of the receiver front end. When the signal energy of a signal exceeds a threshold energy level on one of the plurality of advertisement channels, the method includes the step of locking the output frequency of the LO generator to the one of the plurality of advertisement channels and activating the VGA. The method further includes the steps of controlling a gain of the signal on the one of the plurality of advertisement channels using an automatic gain controller to generate a controlled gain signal, correlating the controlled gain signal from the automatic gain controller with the advertisement packet on the one of the plurality of advertisement channels, and after the correlating, activating the ADC/digitalRx to demodulate the advertisement packet.

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features. Similarly, computer systems are also described that may include one or more processors and one or more memories coupled to the one or more processors. A memory, which can include a non-transitory computer-readable or machine-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to a low power, low latency and high duty cycle scan for BLE, it should be readily understood that such features are not intended to be limiting. The claims that follow this disclosure are intended to define the scope of the protected subject matter.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, or elements.

DETAILED DESCRIPTION

A scan receiver system and method is described herein for a wireless personal area network technology, such as Bluetooth Low Energy (BLE), which enables close to 100% scan duty cycle and extremely low detection latency, while consuming much less power than would be required by using a traditional receiver in always-on mode. For instance, the detection latency is at most a few microseconds. In some implementations consistent with the current subject matter, the receiver operates in a fast channel-hopping, fast energy-detect mode for the majority of the time, without enabling the baseband blocks, such as analog amplifiers, analog-to-digital converters (ADCs), digital receiver physical layer (PHY), or the like.

In some implementations, the receiver includes a local-oscillator (LO) generation circuit with a very fast channel switch time, a fast energy detector, and an ultra-low power bit correlator. The LO generator can be implemented in various ways, for example using a phase-locked loop (PLL) using the same concept as a two-point modulator for a polar transmitter. The second modulation port in this case is driven with the required step control to change the PLL's output frequency in extremely short time (i.e. much less than 1 µs, compared to up to 10 µs for a typical receiver PLL). In some preferred exemplary implementations, an all-digital PLL (ADPLL) can used. Other alternatives for the LO generator include use of a fixed frequency PLL followed by a Digital-to-Time Converter (DTC), or ring-oscillator based Frequency-locked Loop (FLL). The energy detector operates separately from the main receiver's baseband, ADC, or digital path, and is designed to settle within about 1 µs. The correlator is also separate from the main digital path, and implements a low power matching operation of the received signal's frequency deviation waveform versus the expected bit pattern.

In accordance with some implementations, and using BLE technology as an example of a preferred implementation, the receiver system tunes to each of the three BLE advertisement channels in sequence, monitoring the energy from each individual advertisement channel until a threshold is exceeded. At this point, the PLL channel can be fixed, and the receiver's automatic gain control (AGC), analog baseband, ADC, and digital receiver are enabled step-by-step based on the correlator output in order to capture a valid packet, if it exists on that individual advertisement channel.

Figure 1:
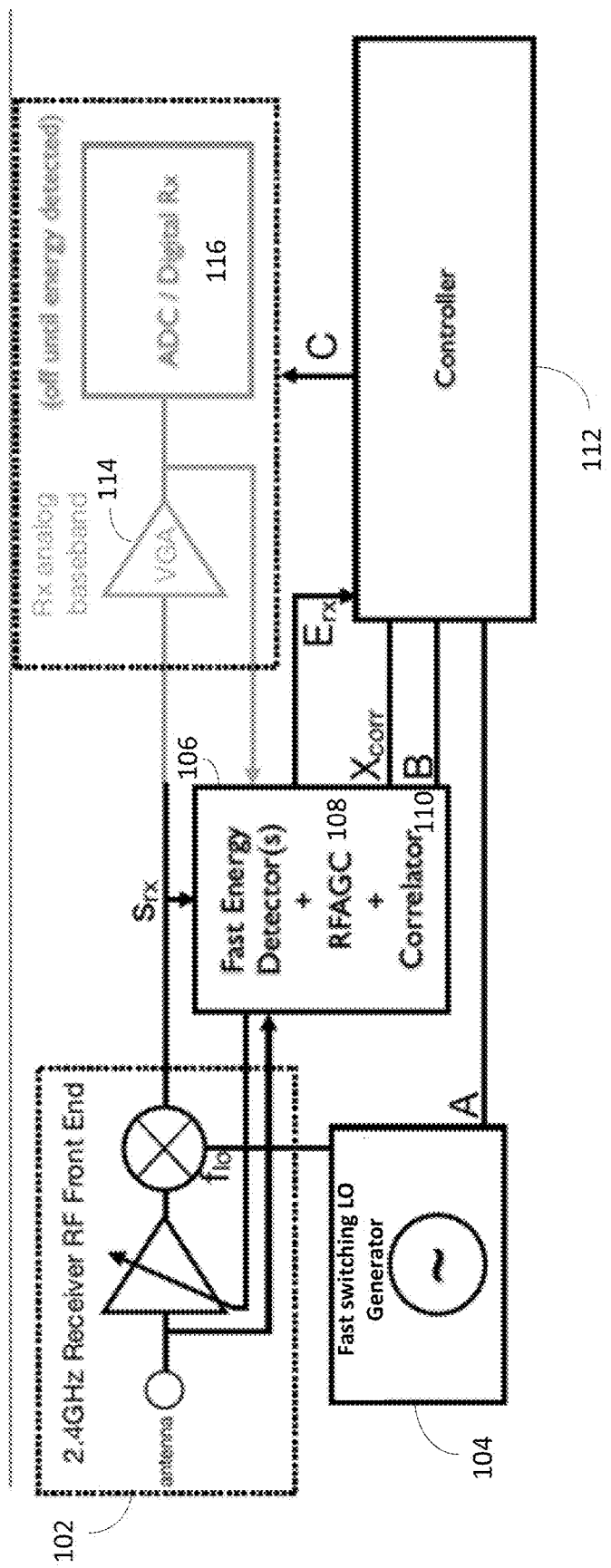
FIG. 1 shows a diagram illustrating aspects of a system showing features consistent with implementations of the current subject matter.

FIG. 1 illustrates a scan receiver system 100 that includes a receiver front end 102, a fast switching LO generator 104, a fast energy detector(s) 106 having an RF automatic gain controller (AGC) 108 and a correlator 110, and a controller 112. The scan receiver system 100 is connected with other receiver blocks, such as a receiver analog baseband variable gain amplifier (VGA) 114 and an analog to digital converter (ADC) 116, a digital receiver, and the like.

The controller sets an output frequency of the LO generator 104, $f_{lo}$, which is initially cycled to receive BLE advertisement channels 37, 38, and 39 in a repeating sequence. In the case of LO generation using a PLL, pre-determined PLL settings (A) are applied to the PLL 104 by the controller 112 for each channel to enable fast switching (i.e. <<1 µs) between channels. For each new channel setting, signal (B) from the controller 112 resets the energy detector 106.

The energy detector 106 monitors an energy of a down-converted baseband intermediate frequency (IF) signal $S_{rx}$ for each channel in the repeating sequence. If energy $E_{rx}$ of signal $S_{rx}$ exceeds a predetermined threshold, indicating an advertisement packet is on-air, the controller 112 fixes fib to the current channel, and fast RFAGC 108 is applied for the remainder of the preamble of the packet, to achieve a higher quality signal $S_{rx}$ for correlation. Optionally, coarse baseband AGC using the Rx VGA may also be included.

The correlator 110 works during the first part of the packet. Correlation may be carried out on the packet's preamble and/or part of the Access Address (for example the first 25% although this is configurable). On reasonable confidence of a preamble and/or Access Address portion correlation or match, the receiver VGA 114 and ADC/digital 115 blocks are enabled by control signal (C) from the controller 112 to complete the full Access Address correlation and demodulate the packet. Accordingly, the digital receiver will work to demodulate $S_{rx}$ only for $E_{rx}$>threshold, which indicates a reasonable probability of an advertisement packet being present.

Figure 2:
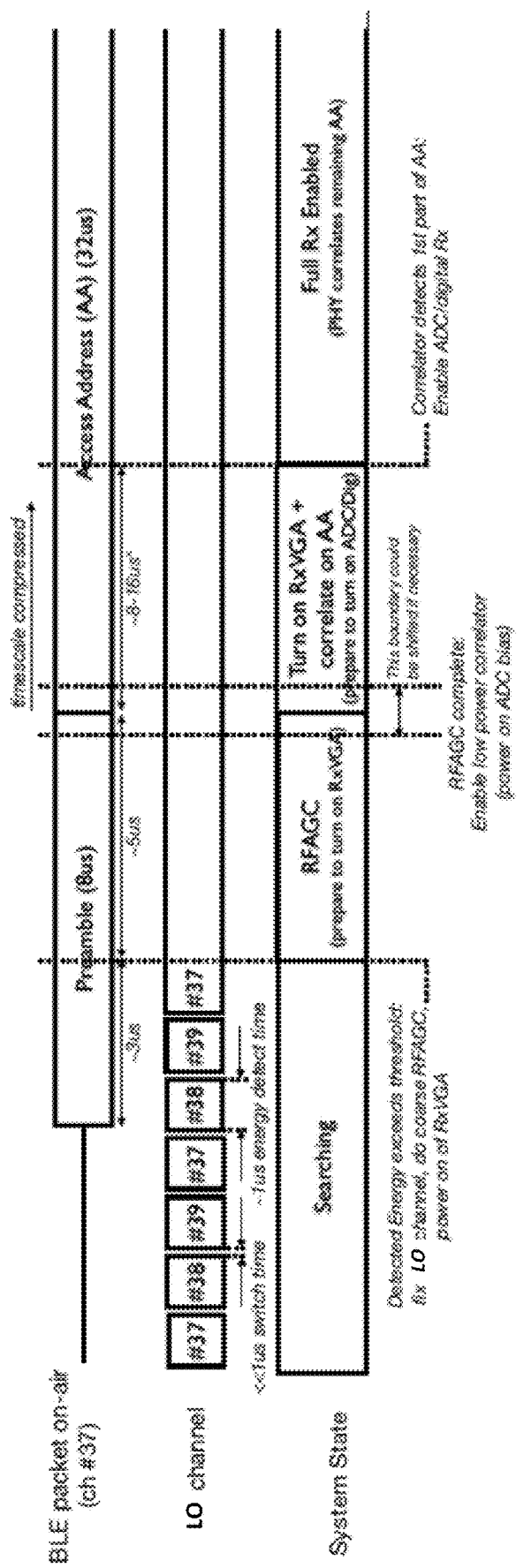
FIG. 2 shows an example timing diagram of a system for minimizing power and latency in a BLE scan.

FIG. 2 is an example timing diagram for the case where the correlator 110 works on the very last part of the packet preamble and on the first part of the Access Address.

Figure 3:
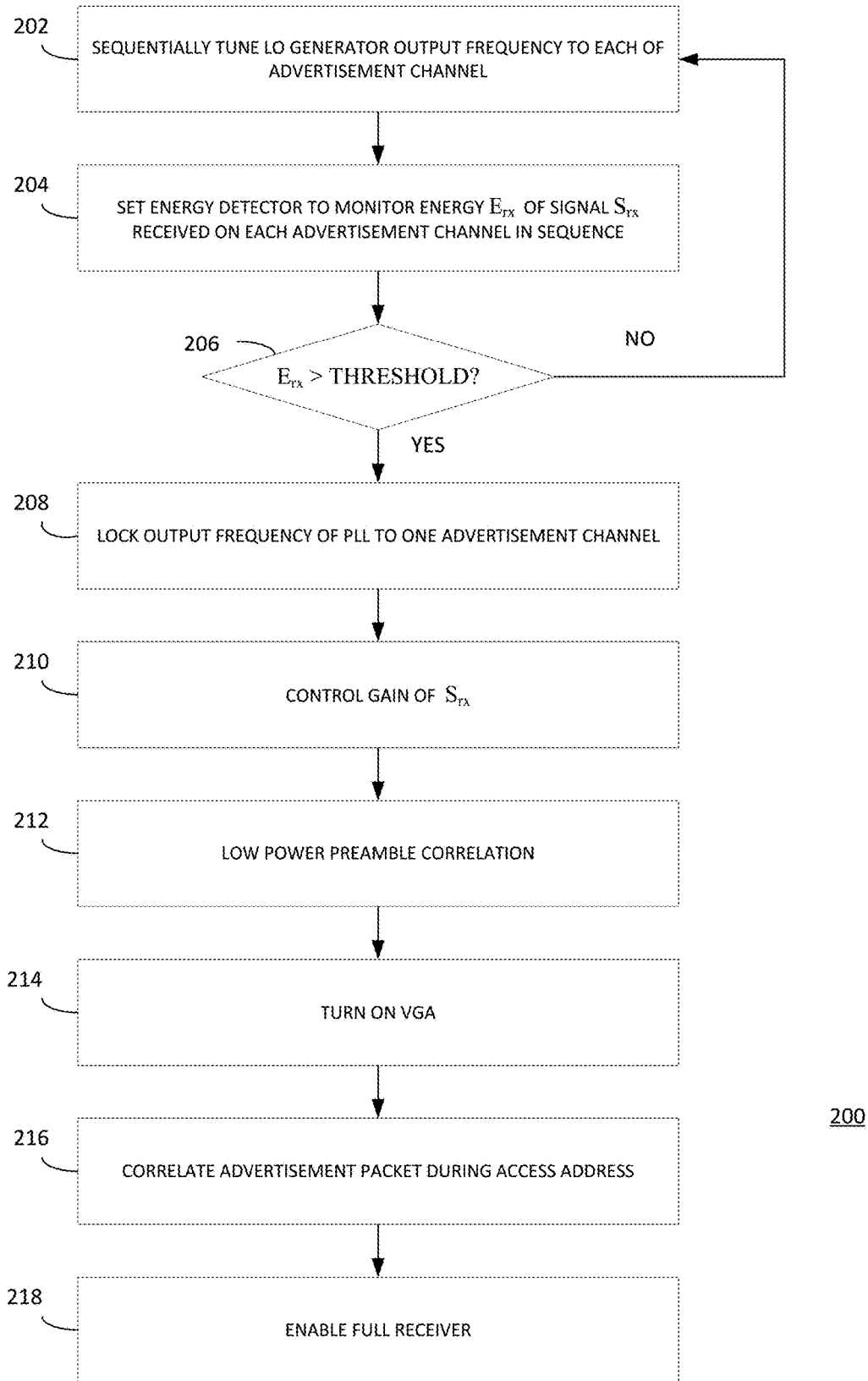
FIG. 3 shows a process flow diagram illustrating aspects of a method having one or more features consistent with implementations of the current subject matter.

FIG. 3 is a flowchart corresponding to FIG. 2, illustrating a method 200 minimizing power and latency in a scan for advertisement packets from one or more peripheral devices in a BLE frequency band having a number, i.e., three, advertisement channels. In a BLE receiver having a receiver front end, a variable gain amplifier (VGA), and an analog to digital converter and digital receiver (ADC/digitalRx), at 202 an output frequency of a LO generator is sequentially tuned to a frequency of each of the advertisement channels at an output of the receiver front end, in a repeating sequence. In some implementations, the output frequency of the LO generator is switched from a first of the advertisement channels to a next advertisement channels in less than 1 microsecond;

Upon switching the output frequency of the LO generator to the next of the plurality of advertisement channels, at 204 an energy detector is set to monitor signal energy $E_{rx}$ of a received signal $S_{rx}$ at the output of the receiver front end. At 206 it is determined whether $E_{rx}$ exceeds a predetermined threshold. If no, then the method repeats at 202. If yes, when the signal energy of a signal exceeds a threshold energy level on one of the advertisement channels, at 208 the output frequency of the LO generator is fixed to that advertisement channel. At 210, the gain of that signal is controlled by an automatic gain controller that is turned on after LO generator fix. The automatic gain controller will generate a higher quality, i.e. controlled gain, signal. At 212, low power preamble correlation is performed. At 214, the VGA of the receiver is turned on and activated and the correlator is enabled for a configurable period of time (in the example given in FIG. 2, for ~8-16 us). At 216, if the correlator output exceeds a programmable threshold, thus indicating the presence of a valid advertisement packet on the current advertisement channel, then at 218 the ADC/digitalRx are turned on and activated or enabled to complete Access Address correlation and subsequently demodulate the advertisement packet.

This multi-step, channel hopping method minimizes latency by maximizing receiver "on" times in a given power budget (i.e. whenever an advertisement packet is on-air it is less likely to be missed by the receiver), and avoiding "wasted" time spent tuned to a single advertising channel when that channel is blocked by high power interfering signals. The power of the full receiver, including ADC and digital receiver, is only consumed when a packet is very probably on-air, minimizing long term scan energy consumption. If at any step in the power-up process a valid packet condition is failed, the system can immediately return to the low-power initial state.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An apparatus for simultaneously minimizing power and latency in a scan for advertisement packets from one or more peripheral devices in a Bluetooth Low Energy (BLE) frequency band having a plurality of advertisement channels, the apparatus comprising:
   a receiver front end configured to receive signals in the BLE frequency band;
   a local oscillator (LO) generator having an input connected with an output of the receiver front end, the LO generator having an output frequency that is sequentially tuned, in a repeating sequence, to a frequency of each of the plurality of advertisement channels at the output of the receiver front end;

an energy detector connected with the receiver front end, and configured to monitor signal energy on each of the plurality of advertisement channels in the repeating sequence, and when the signal energy of a signal exceeds a threshold energy level on one of the plurality of advertisement channels, fix the output frequency of the LO generator to the one of the plurality of advertisement channels;

an automatic gain controller configured to control a gain of the signal on the one of the plurality of advertisement channels to generate a controlled gain signal; and a correlator to correlate the controlled gain signal from the automatic gain controller with an advertisement packet on the one of the plurality of advertisement channels.

2. The apparatus in accordance with claim 1, further comprising a controller configured to tune the output frequency of the LO generator, and in response to receiving an indication of the signal energy of the signal exceeding the threshold energy level, enable the automatic gain controller and correlator.

3. The apparatus in accordance with claim 2, further comprising a variable gain amplifier (VGA) and an analog to digital converter and digital receiver (ADC/digitalRx), the VGA and ADC/digitalRx being enabled by the controller after receiving the indication of the signal energy of the signal exceeding the threshold energy level.

4. The apparatus in accordance with claim 1, wherein the controlled gain signal represents the advertisement packet, wherein the advertisement packet includes a preamble and an access address, and wherein the correlator is configured to correlate the preamble and/or a first portion of the access address with the advertisement packet.

5. The apparatus in accordance with claim 1, wherein output frequency of the LO generator is switched from a first of the plurality of advertisement channels to a next of the plurality of advertisement channels in less than 1 microsecond.

6. The apparatus in accordance with claim 5, wherein the energy detector is configured to settle on the signal energy from the receiver front end within approximately 1 microsecond from the LO generator switching to the next of the plurality of advertisement channels.

7. The apparatus in accordance with claim 1, wherein the LO generator is implemented using an all-digital phase-locked loop (ADPLL).

8. A communication system for receiving signals in a Bluetooth Low Energy (BLE) frequency band having a plurality of advertisement channels, the system comprising:
  a receiver front end configured to receive the signals in the BLE frequency band, the receiver front end having an output;
  a variable gain amplifier (VGA) in communication with the output of the receiver front end, the VGA being enabled upon a detection of signals representing an advertisement packet on one of the plurality of advertisement channels to amplify the signals;
  an analog to digital converter and digital receiver (ADC/digitalRx) in communication with the VGA, the ADC/digitalRx being enabled upon the detection and a correlation of the signals with the advertisement packet to demodulate the amplified signals;
  a low-power scanner configured for the detection and the correlation, the low-power scanner comprising:
    a LO generator having an input connected with the output of the receiver front end, the LO generator having an output frequency that is sequentially tuned, in a repeating sequence, to a frequency of each of the plurality of advertisement channels at the output of the receiver front end;
    an energy detector connected with the output of the receiver front end, and configured to monitor signal energy on each of the plurality of advertisement channels in the repeating sequence, and when the signal energy of a signal exceeds a threshold energy level on one of the plurality of advertisement channels, fix the output frequency of the LO generator to the one of the plurality of advertisement channels;
    an automatic gain controller configured to control a gain of the signal on the one of the plurality of advertisement channels to generate a controlled gain signal; and
    a correlator to correlate the controlled gain signal from the automatic gain controller with the advertisement packet on the one of the plurality of advertisement channels.

9. The system in accordance with claim 8, wherein the low power scanner further comprises a controller configured to tune the output frequency of the LO generator, and in response to receiving an indication of the signal energy of the signal exceeding the threshold energy level, enable the automatic gain controller and correlator.

10. The system in accordance with claim 8, wherein the controlled gain signal represents the advertisement packet, wherein the advertisement packet includes a preamble and an access address, and wherein the correlator is configured to correlate the preamble and/or a first portion of the access address with the advertisement packet.

11. The system in accordance with claim 8, wherein output frequency of the LO generator is switched from a first of the plurality of advertisement channels to a next of the plurality of advertisement channels in less than 1 microsecond.

12. The system in accordance with claim 11, wherein the energy detector is configured to settle on the signal energy from the receiver front end within approximately 1 microsecond from the LO generator switching to the next of the plurality of advertisement channels.

13. The system in accordance with claim 8, wherein the LO generator is implemented using an all-digital phase-locked loop (ADPLL).

14. In a Bluetooth Low Energy (BLE) receiver having a receiver front end, a variable gain amplifier (VGA), and an analog to digital converter and digital receiver (ADC/digitalRx), a method of minimizing power and latency in a scan for advertisement packets from one or more peripheral devices in a BLE frequency band having a plurality of advertisement channels, the method comprising:
  sequentially tuning, in a repeating sequence, an output frequency of a LO generator to a frequency of each of the plurality of advertisement channels at an output of the receiver front end, the output frequency of the LO generator being switched from a first of the plurality of advertisement channels to a next of the plurality of advertisement channels in less than 1 microsecond;
  upon switching the output frequency of the LO generator to the next of the plurality of advertisement channels, setting an energy detector to monitor signal energy on the output of the receiver front end;
  when the signal energy of a signal exceeds a threshold energy level on one of the plurality of advertisement channels, locking the output frequency of the LO generator to the one of the plurality of advertisement channels and activating the VGA;

controlling a gain of the signal on the one of the plurality of advertisement channels using an automatic gain controller to generate a controlled gain signal;

correlating the controlled gain signal from the automatic gain controller with the advertisement packet on the one of the plurality of advertisement channels; and after the correlating, activating the ADC/digitalRx to demodulate the advertisement packet.

15. The method in accordance with claim 14, wherein the low power scanner further comprises a controller configured to tune the output frequency of the LO generator, and in response to receiving an indication of the signal energy of the signal exceeding the threshold energy level, enable the automatic gain controller and correlator.

16. The method in accordance with claim 14, wherein the controlled gain signal represents the advertisement packet, wherein the advertisement packet includes a preamble and an access address, and wherein the correlator is configured to correlate the preamble and/or a first portion of the access address with the advertisement packet.

17. The method in accordance with claim 14, wherein output frequency of the LO generator is switched from a first of the plurality of advertisement channels to a next of the plurality of advertisement channels in less than 1 microsecond.

18. The method in accordance with claim 14, wherein the LO generator is implemented using an all-digital phase-locked loop (ADPLL).

19. The method in accordance with claim 18, wherein the energy detector is configured to settle on the signal energy from the receiver front end within approximately 10 microseconds from the LO generator switching to the next of the plurality of advertisement channels.

20. The method in accordance with claim 18, wherein the energy detector is configured to settle on the signal energy from the receiver front end within approximately 1 microsecond from the LO generator switching to the next of the plurality of advertisement channels.

* * * * *